United States Patent [19]

Bickley et al.

[11] Patent Number: 4,613,825
[45] Date of Patent: Sep. 23, 1986

[54] RAPID ACQUISITION, TRACKING PLL WITH FAST AND SLOW SWEEP SPEEDS

[75] Inventors: Robert H. Bickley, Scottsdale; Christopher D. Broughton, Mesa, both of Ariz.

[73] Assignee: Motorola, Inc., Schaumburg, Ill.

[21] Appl. No.: 684,222

[22] Filed: Dec. 20, 1984

[51] Int. Cl.⁴ ............................................. H03L 7/06
[52] U.S. Cl. .......................................... 331/4; 331/17; 331/DIG. 2
[58] Field of Search ....................... 331/1 A, 4, 17, 25, 331/DIG. 2; 329/122, 124

[56] References Cited

U.S. PATENT DOCUMENTS

| | | | |
|---|---|---|---|
| 3,777,276 | 12/1973 | Klein | 331/1 A X |
| 3,909,735 | 9/1975 | Anderson et al. | 329/122 |
| 4,115,745 | 9/1978 | Egan | 331/DIG. 2 X |
| 4,316,154 | 2/1982 | Krause | 331/4 |
| 4,419,760 | 12/1983 | Bjornholt | 329/122 X |
| 4,423,390 | 12/1983 | Waters | 331/DIG. 2 X |

Primary Examiner—James B. Mullins
Assistant Examiner—D. C. Mis
Attorney, Agent, or Firm—Lowell W. Gresham

[57] ABSTRACT

A tracking phase locked loop circuit in which the frequency of an oscillator portion thereof is varied over a range of frequencies in search of an incoming carrier is disclosed. The varying frequency occurs at two different sweep rates. A faster rate is used until the frequency of the phase locked loop's oscillator nears the frequency of the incoming carrier, and a slower rate is used until the circuit locks onto the carrier. A filter couples between mixer and sweep control circuit portions of the phase locked loop to provide information concerning the difference between oscillator frequency and incoming carrier frequency. The sweep control circuit distinguishes between the carrier and noise and switches rates accordingly.

16 Claims, 5 Drawing Figures

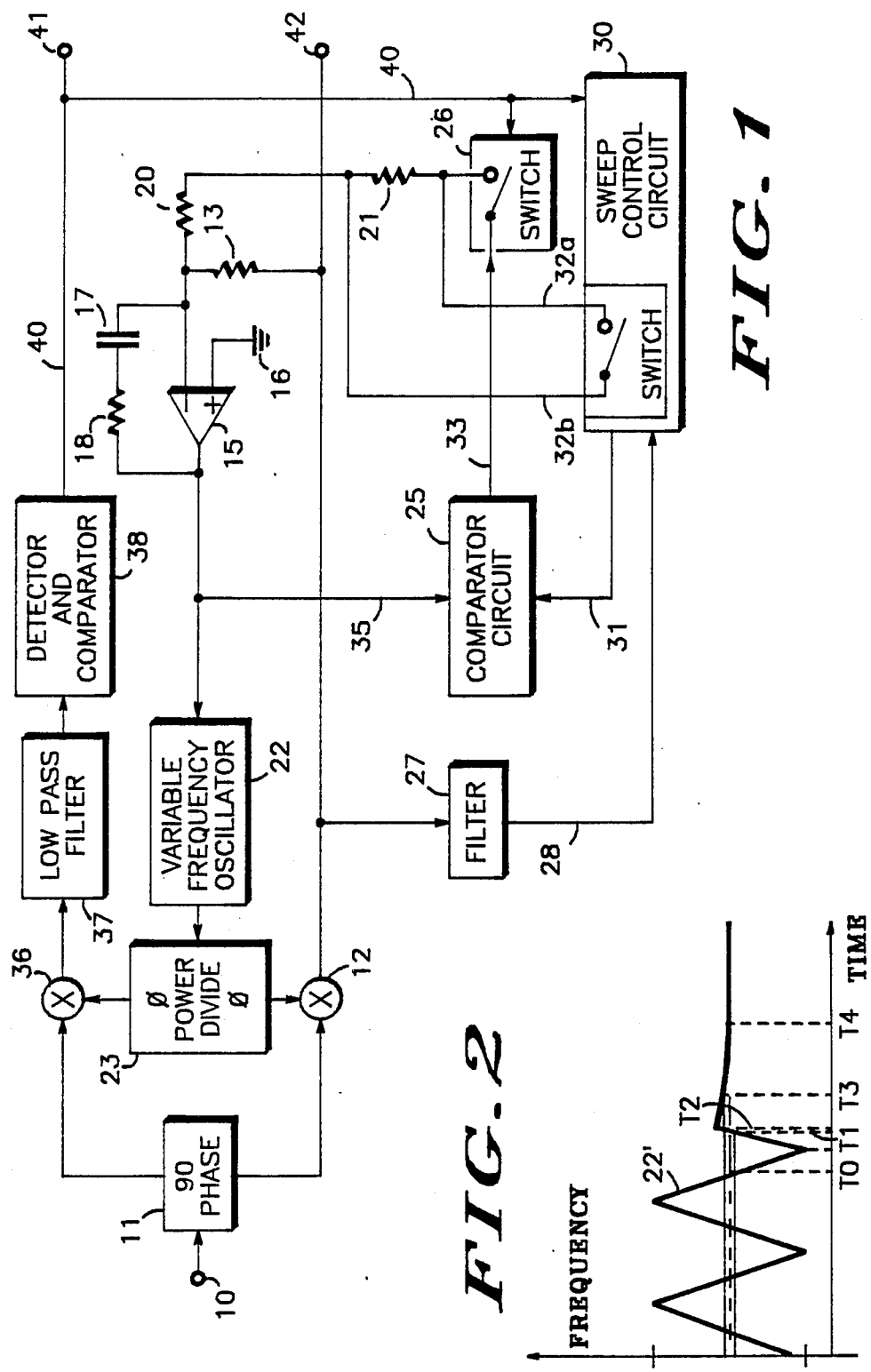

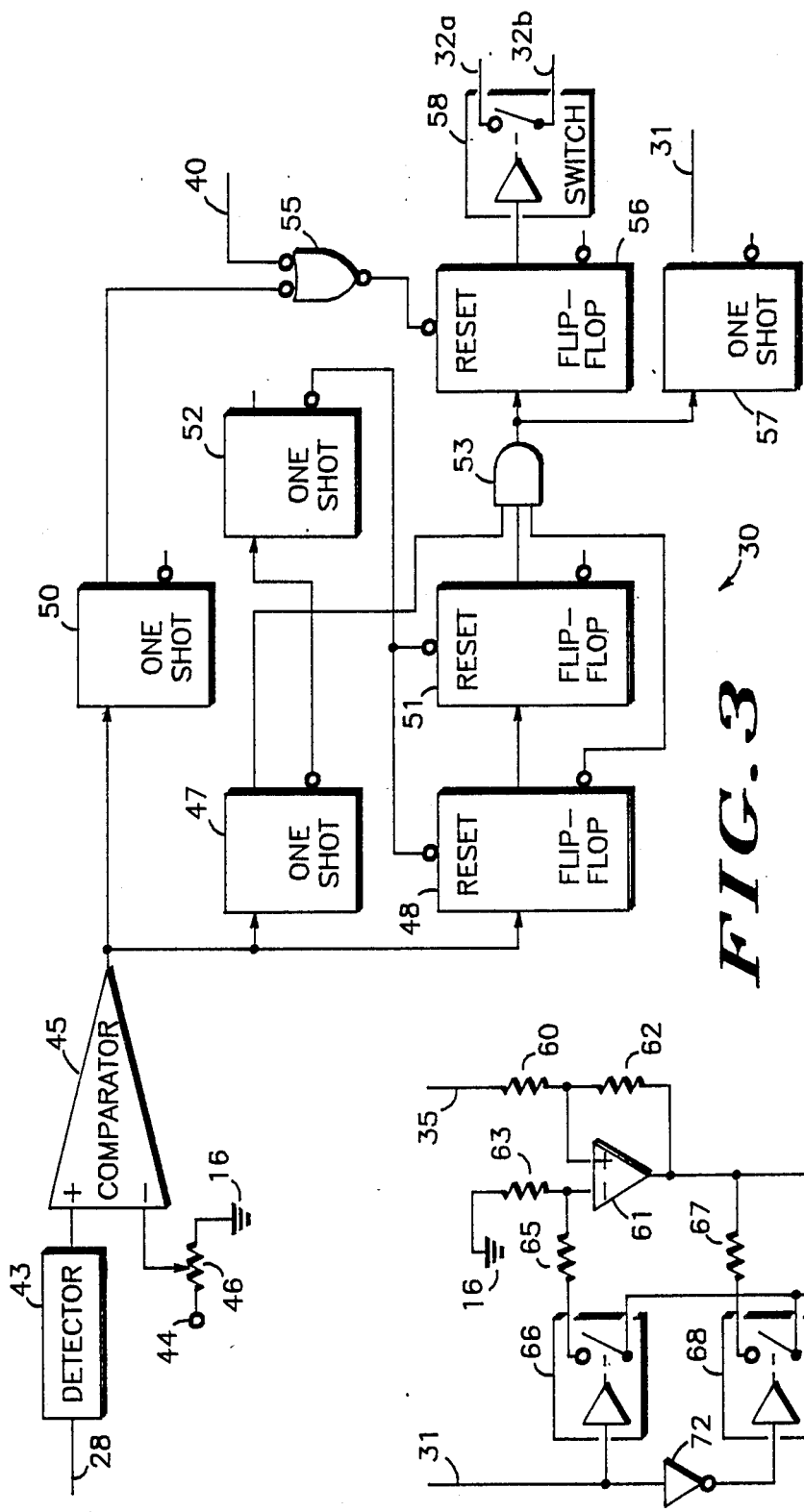

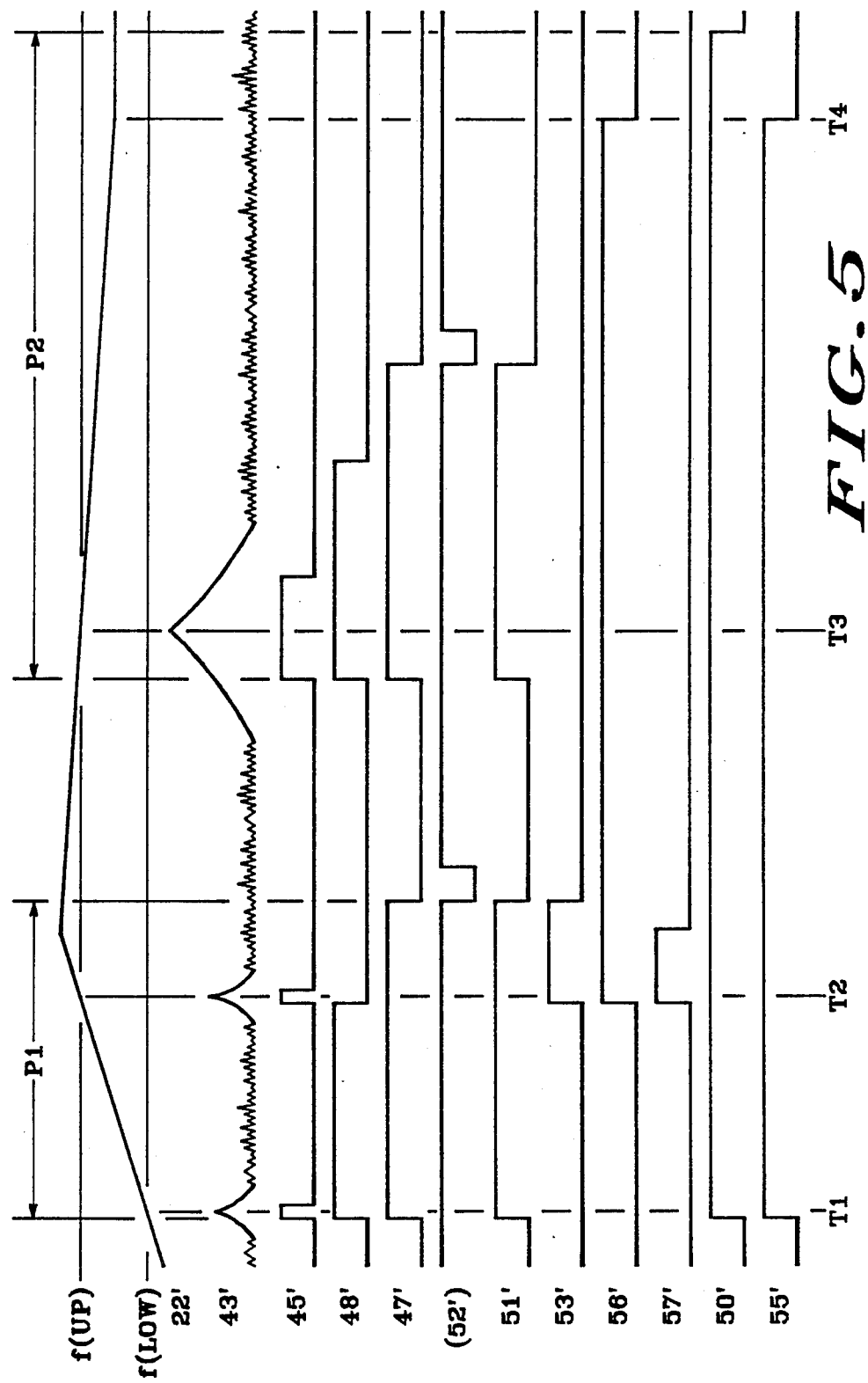

RAPID ACQUISITION, TRACKING PLL WITH FAST AND SLOW SWEEP SPEEDS

BACKGROUND OF THE INVENTION

This invention relates to a phase locked loop circuit. Specifically, the present invention relates to a sweep acquisition phase locked loop wherein an oscillator's frequency varies over a relatively wide range of frequencies to increase loop capture range. More specifically, the present invention relates to a sweep acquisition phase locked loop wherein sweep rate of a tracking signal is substantially greater than is permitted by loop bandwidth.

As is well known in the art, phase locked loops (PLLs) can lock to a carrier which has a frequency that is not precisely known. The ability of the PLL to lock to the carrier depends upon the PLL's bandwidth and the signal-to-noise ratio of the carrier. If the carrier is known to exhibit a frequency within a small range of frequencies, then the PLL need not employ sweep acquisition because the natural hunting tendency of the PLL will permit the loop to lock to the carrier.

However, if the frequency uncertainty of the carrier is relatively large, then the PLL may employ a swept acquisition. Swept acquisition refers to the use of additional circuitry which causes an oscillator portion of the PLL to vary its oscillation frequency over a relatively large range of frequencies. However, an undesirable consequence of sweep acquisition is that the carrier must exhibit a relatively large signal-to-noise ratio before lock can be achieved.

The term "sweep rate" refers to the speed at which the oscillator's frequency changes. In PLLs which utilize swept acquisition, slower sweep rates permit locking to carriers having lower signal-to-noise ratios.

A problem associated with tracking PLLs occurs when carrier frequency may occur anywhere within a relatively large range of frequencies and when the carrier may exhibit a low signal-to-noise ratio. In order to lock to a signal having a low signal-to-noise ratio, the PLL sweep rate must be fairly slow. Further, the sweep must vary the frequency of the oscillator over a relatively large frequency range to insure acquisition of the carrier. Accordingly, such PLL's may require an undesirably long period of time to achieve a locked condition after the application of a carrier.

SUMMARY OF THE INVENTION

Thus, it is an object of the present invention to provide an improved phase locked loop that permits rapid acquisition of a carrier in spite of a substantial frequency uncertainty and in spite of low signal-to-noise ratios.

The above and other objects and advantages of the present invention are carried out in one form by a mixer and a variable frequency oscillator connected so that the mixer receives an incoming signal and an output from the variable frequency oscillator. A ramp generator having two sweep rates and two sweep directions controls the variable frequency oscillator. A filter has an input connected to the mixer output and an output which connects to a sweep control circuit. The sweep control circuit controls the ramp generator and specified which of the two sweep rates is exhibited by the ramp generator.

BRIEF DESCRIPTION OF THE DRAWINGS

A more complete understanding of the present invention may be derived by reference to the detailed description and the claims when considered in connection with the accompanying drawings, wherein:

FIG. 1 shows a block diagram of the present invention;

FIG. 2 shows a graph of the frequency exhibited by a signal output at an oscillator portion of the present invention;

FIG. 3 shows a circuit diagram of a sweep control circuit portion of the present invention.

FIG. 4 shows a circuit diagram of a comparator circuit portion of one embodiment of the present invention; and FIG. 5 shows a timing diagram of signals generated within the circuit shown in FIG. 3.

DETAILED DESCRIPTION

FIG. 1 shows a block diagram of the present invention. A terminal 10 receives an incoming signal. Terminal 10 connects to an input of a 90° phase shifter 11. One output of phase shifter 11 connects to a first input of a mixer, or phase comparator, 12, and another output of phase shifter 11 connects to a first input of a mixer 36. A second input of mixer 12 and a second input of mixer 36 connect to separate outputs of 0° power divider 23.

An output of mixer 36 connects to an input of a low pass filter 37, an output of low pass filter 37 connects to an input of a detector and comparator circuit 38, and an output of circuit 38 represents node 40 and connects to an output terminal 41. Terminal 41 provides a signal which indicates when the present invention is in an "inlock" state.

The output of mixer 12 connects to an input of a filter 27, a first node of a resistor 13, and an output terminal 42. Terminal 42 provides a beat signal. A second node of resistor 13 connects to a first node of a resistor 20, a first node of a capacitor 17, and an inverting, or signal, input of an operational amplifier (op amp), a non-inverting input of op amp 15 connects to a ground terminal 16. A second node of capacitor 17 connects to a first node of a resistor 18, and a second node of resistor 18 connects to an output of op amp 15. The output of op amp 15 represents a node 35 to which are connected a control input of a variable frequency oscillator 22 and an input of a comparator circuit 25. An output of variable frequency oscillator 22 connects to an input of 0° power divider 23.

Filter 27 has an output, represented as node 28, connected to an input of a sweep control circuit 30. Sweep control circuit 30 contains a switch portion thereof which connects in parallel across a resistor 21 at nodes 32a and 32b. Node 32b also connects to a second node of resistor 20. An output of comparator circuit 25, which is represented as node 33, connects to a first contact of a switch 26. A second contact of switch 26 connects to node 32a. A control input to switch 26 connects to node 40. Sweep control circuit 30 also contains an input 31 which connects to a polarity control input of comparator circuit 25. Additionally, sweep control circuit 30 contains an input which couples to node 40.

Referring to FIG. 2, the present invention operates in three distinct states. A search state, where no carrier is present, represents the first state. The search state occurs before time $T_0$. A capture state, where a carrier has just recently appeared but the PLL is not yet locked to the carrier, represents the second state. The capture state occurs between time $T_0$ and time $T_4$. An inlock state, where the PLL is locked to the incoming carrier, represents the third state. The inlock state occurs after time $T_4$.

In the search state no signal above a noise level is presented at terminal 10 (see FIG. 1). Thus, only a low-level noise signal occurs at the first inputs of mixers 12 and 36. The output from mixer 36 is a lowlevel noise signal which is attenuated in low pass filter 37. Accordingly, detector and comparator circuit 38 produces an output on node 40 which indicates that the PLL is not in the inlock state. This signal on node 40 causes switch 26 to remain closed.

A multirate ramp generator portion of the present invention includes op amp 15, resistor 18, capacitor 17, and resistors 20 and 21. Comparator circuit 25 repetitively changes polarity of a step signal at node 33. The step signal is presented to the ramp generator through switch 26. The ramp generator functions as an integrator and the output of op amp 15 at node 35 ramps in an increasing or decreasing direction in response to the step signal. Resistor 13 feeds back the beat signal from the output of mixer 12 to op amp 15. However, when the present invention is in the search state the signal represents only a low-level noise signal which has no significant influence over the output of op amp 15 compared to the step signal applied by comparator circuit 25.

In response to the ramp signal, variable frequency oscillator 22 changes frequency. The frequency of the signal output from oscillator 22 is referenced as trace 22' in FIG. 2. Comparator circuit 25 changes the polarity of the step signal applied at node 33 whenever the ramp signal it receives at node 35 reaches upper and lower limits. For example, a preferred embodiment of the present invention is designed to accomodate an incoming carrier signal of approximately 30 MHz±375 KHz. Variable frequency oscillator 22 is a voltage controlled oscillator that generates a signal which varies in frequency between 29.625 MHz and 30.375 MHz. Thus, the input signal to oscillator 22 represents a voltage level which varies between a lower limit corresponding to 29.625 MHz and an upper limit corresponding to 30.375 MHz. When comparator circuit 25 detects the ramp signal exhibiting a voltage equivalent to either the lower or upper limit, it reverses polarity of the step signal applied at node 33. The sweep of the ramp signal changes from an increasing to a decreasing direction, or vice-versa, accordingly.

When a carrier signal is first applied at terminal 10 the present invention enters the capture state. Initially, the frequency of the signal output from oscillator 22 is being swept in response to the ramp signal applied at node 35. This initial sweeping occurs at a "faster" sweep rate. In the preferred embodiment this faster sweep rate is approximately 14 MHz per second. The switch portion of sweep control circuit 30 selects the faster sweep rate by closing and shorting, or electrically removing, resistor 21 from the multirate ramp generator circuit. Thus, the total input resistance to op amp 15 decreases, the amount of time required to charge capacitor 17 decreases, and the sweep rate increases. Of course, those skilled in the art recognize that resistors 20 and 21 may alternatively be connected in parallel in which case the switch portion of sweep control circuit 30 should be connected in series with either resistor 20 or 21.

In one embodiment of the present invention filter 27 represents a bandpass filter. The bandwidth of filter 27 is relatively narrow when compared to the frequency uncertainty of the incoming carrier signal. Furthermore, the center frequency of filter 27 is relatively low when compared to the range of frequencies generated by variable frequency oscillator 22. For the preferred embodiment, filter 27 represents a bandpass filter having a 1.4 KHz bandwidth centered about 4.7 KHz.

The output from mixer 12 may be characterized as a beat signal which has spectral components having frequencies equivalent to the sum and difference of the incoming carrier frequencies and the oscillator frequency. Filter 27 responds to the spectral components of the beat signal associated with only the difference in frequency between the incoming carrier and oscillator 22. The beat signal decreases in frequency as the frequency of oscillator 22 approaches the frequency of the incoming carrier. At a time $T_1$ shown in FIG. 2, the frequency of oscillator 22 equals the frequency of the incoming carrier minus the center frequency of filter 27. As variable frequency oscillator 22 continues to sweep at the faster sweep rate its frequency approaches and then passes the frequency of the incoming signal. At a time $T_2$ the frequency of oscillator 22 equals the center frequency of filter 27 plus the frequency of the incoming carrier signal. An inlock state may not occur because the sweep rate is too fast for the loop bandwith. Alternatively, the oscillator 22 frequency may initially be greater than the carrier frequency. In this case the sum of the carrier and filter 27 center frequencies occurs at time $T_1$ and the difference occurs at time $T_2$.

Sweep control circuit 30 detects the occurrence of $T_1$ and $T_2$ by monitoring a bandpass signal output from filter 27 on mode 28. After the occurrence of $T_2$, sweep control circuit 30 causes the multirate ramp generator to switch to a "slower" sweep rate by opening the switch portion of sweep control circuit 30. At the same time, sweep control circuit 30 causes comparator circuit 25 to reverse the polarity of the step signal by providing an output to the polarity control input of comparator circuit 25 on node 31. At a time $T_3$ the frequency of an oscillator 22 is again equivalent to the center frequency of filter 27 plus the frequency of the incoming carrier. In the preferred embodiment the slower sweep rate is approximately 550 KHz per second which is sufficiently slow to permit the PLL to achieve lock. At a time $T_4$ the present invention leaves the capture state and enters the inlock state.

While the present invention is in the inlock state, the frequency of oscillator 22 tracks the frequency of the incoming carrier. Op amp 15 serves as a lowpass filter for the phase locked loop. The best signal represents a DC level when the incoming carrier does not change in time. Likewise, the output of mixer 36 is a DC level, but since the first input to mixer 36 represents an incoming signal which is 90° out-of-phase with the first input to mixer 12 the DC levels of the two signals differ. Low pass filter 37 and detector 38 recognize this DC level and provide a signal on node 40 signalling that the present invention is in the inlock state. The inlock signal provided on node 40 causes switch 26 to open and the step signal is removed from the ramp generator.

A second embodiment of the present invention might implement filter 27 as a low pass filter rather than as a band pass filter. In this second embodiment sweep control circuit 30 need only detect the occurrence of $T_1$ before switching the multirate ramp generator to the slower sweep rate. Furthermore, in the second embodiment sweep control circuit 30 need not provide the output to comparator circuit 25 at node 31 for reversing the polarity of the step signal. The multirate ramp generator will cause the present invention to achieve lock by continuing to sweep without changing sweep directions. However, the continued sweep will occur at a reduced sweep rate.

A comparison of the first and second embodiments mentioned above considers the amount of noise which is anticipated. Both embodiments adequately insure that sweep control circuit 30 will not mistakenly fail to switch to the slower sweep rate. However, the first embodiment does a better job of insuring the sweep control circuit 30 will not mistakenly switch to the slower sweep rate in a noisy environment.

A specific embodiment of control circuit 30 which implements the first embodiment described above is shown in FIG. 3. Node 28 connects to an input of a detector 43 whose output connects to a non-inverting input of a comparator 45. An inverting input of comparator 45 connects to a tap of a variable resistor 46 which is connected between a terminal 44 adapted to receive a positive voltage and ground 16. An output of comparator 45 connects to a clock input of a flip-flop 48, a trigger input of a one-shot multivibrator 47, and a trigger input of a one-shot 50. A non-inverting output of flip-flop 48 connects to a clock input of a flip-flop 51. A non-inverting output of one-shot 47, a non-inverting output of flip-flop 51, and an inverting output of flip-flop 48 each connect to inputs of a 3-input AND gate 53. An inverting output from one-shot 47 connects to a trigger input of a one-shot 52; and, an inverting output from one-shot 52 connects to reset inputs of flip-flops 48 and 51. An output from AND gate 53 connects to the clock input of a flip-flop 56 and to a trigger input of a one-shot 57. A non-inverting output from one-shot 50 connects to one input of a 2-input AND gate 55, and node 40 connects to the other input of 2-input AND gate 55. The output of 2 input AND gate 55 connects to a reset input of flip-flop 56. A non-inverting output of flip-flop 56 connects to a control input of a switch 58, and the contacts of switch 58 connect to nodes 32a and 32b. A non-inverting output of one-shot 57 connects to a node 31.

FIG. 5 shows a timing diagram which describes the operation of the embodiment of sweep control circuit 30 shown in FIG. 3. Trace 22' shows the frequency output from oscillator 22 and corresponds to the trace 22' shown in FIG. 2. Trace 43' illustrates an example output from detector 43. Signal peaks are shown to occur at times $T_1$, $T_2$, and $T_3$. As shown in FIG. 5, noise peaks may occur at any time.

Detector 43 interfaces the filter output to comparator 45. Thus, an amplitude detector is provided which consists of detector 43 and comparator 45. Comparator 45 converts the badnpass signal output from filter 27 (see FIG. 1) into pulses. Variable resistor 46 is adjusted so that most noise peaks do not cause comparator 45 to generate a pulse. Thus, as shown in trace 45' comparator 45 generates pulses which correspond in time, or occur, whenever a signal peak is detected. However, it should be recognized that a significant probability exists that a noise peak rather than signal peak may produce a pulse. For example, if resistor 46 is adjusted so that comparator 45 produces a pulse whenever it receives a signal at a level that is 6 dB above average noise which has a Rayleigh distribution, then a 14% probability exists that the signal represents noise.

In this embodiment all flip-flops and one-shots clock and trigger on rising edges. Furthermore, all flip-flops toggle upon the receipt of a clock pulse and reset upon the receipt of a low level signal. Of course, those skilled in the art will recognize that these signal conventions are for the purpose of teaching the present invention and are not necessary to its implementation.

At time $T_1$ a first pulse occurs as is shown by trace 45' in FIG. 5. This first pulse causes flip-flop 48 to toggle, triggers a first timer represented by one-shot 47, and triggers a second timer represented by one-shot 50. Traces 47', 48' and 50' represent signals produced on the non-inverting outputs of one-shot 47, flip-flop 48, and one-shot 50, respectively. The toggling of flip-flop 48 clocks flip-flop 51, as shown in trace 51'. As can be seen in FIG. 5, no signals change state in this scenario until the receipt of a second pulse 45' which occurs at time $T_2$. This second pulse causes flip-flop 48 to toggle and place the output of AND gate 53 in a high level as shown in trace 53'. The rising edge signal from AND gate 53 clocks flip-flop 56 as shown in trace 56' and triggers one-shot 57, as shown in trace 57'. The output from flip-flop 56 controls the opening and closing of switch 58 and the faster and slower sweep rates associated with the present invention. Thus, after the receipt of a second pulse 45', switch 58 opens causing the present invention to sweep at the slower sweep rate.

As mentioned above, it is always possible that a pulse 45' may represent a mere noise peak rather than a signal peak. Accordingly, the first timer represented by one-shot 47 and the second timer represented by one-shot 50 aid in distinguishing signal peaks from noise peaks. One-shot 47 is configured in a non-retriggerable mode. Further, one-shot 47 is set to remain active for a time period $P_1$ which is slightly longer than the time expected to transpire between $T_1$ and $T_2$. For the preferred embodiment a fast sweep rate of 14 MHz per second and a bandpass filter center frequency of 4.7 KHz dictate an anticipated time between signal peaks of 52 milliseconds. $P_1$ would be set slightly longer than this time period, say 75 milliseconds. Accordingly, in order for sweep control circuit 30 to cause the ramp generator to switch to the slower sweep rate two pulses 45' must occur within the 75 milliseconds. This reduces the probability of mistakenly switching to the slow sweep rate upon the occurrence of a noise peak. One-shot 52 triggers upon the expiration of time period $P_1$. Trace (52') represents the inverting output from one-shot 52. This pulse resets flip-flops 48 and 51 and prohibits future clocking of flip-flop 56.

One-shot 50 is configured in a retriggerable mode and set to have a time period $P_2$. $P_2$ represents a time greater than the time occurring between $T_3$ and $T_4$. This time period must also be greater than the time which occurs between $T_2$ and $T_3$ and between $T_1$ and $T_2$. Traces 50' and 55' represent the non-inverting output from one-shot 50 and the output from 2 input AND gate 55, respectively. As can be seen from FIG. 5, one-shot 50 holds flip-flop 56 in a reset mode until a first pulse 45' is received. The receipt of the first pulse 45' takes flip-flop 56 out of the reset mode and permits flip-flop 56 to change states upon receiving a clock signal from AND gate 53. The receipt of the second pulse 45' at time $T_2$ merely retriggers the second timer and prevents flip-flop 56 from being reset. Likewise, the receipt of the third pulse 45' at time $T_3$ again retriggers one-shot 50 and prohibits flip-flop 56 from being reset. Traces 55′ and 56′ go low at time T4, indicating that an inlock signal received at node 40 (not shown) causes AND gate 55 to reset flip-flop 56. If sweep control circuit 30 had mistakenly switched to the slow sweep rate based on the receipt of prior occurring noise peaks, an inlock signal would not occur on node 40 and second timer 50 would reset flip-flop 56 at a time period P2 after the occurrence of third pulse 45′. Thus, the faster sweep rate would be resumed.

FIG. 4 shows one embodiment of comparator circuit which may be used with sweep control circuit 30. A resistor 60 connects between node 35 and a non-inverting input of an analog comparator or op amp 61. A resistor 62 connects between the non-inverting input of op amp 61 and an output of op amp 61. The output of op amp 61 connects to node 33. A resistor 63 connects between ground 16 and an inverting input of op amp 61; and, a resistor 65 connects between the inverting input of op amp 61 and a contact of a switch 66. Another contact of switch 66 connects to a contact of a switch 68 and to a first node of a capacitor 70. A second node of capacitor 70 connects to ground 16. A resistor 67 connects between the output of op amp 61 and another contact of switch 68. Node 31 connects to a control input of switch 66 and an input to inverter 72. An output of inverter 72 connects to a control input of switch 68.

Comparator circuit 25 operates independently from the sweep rate of the multirate ramp generator. The ramp generator represents an inverting amplifier and therefore sweeps in a decreasing direction in response to a positive going step input on node 33. Accordingly, assuming that node 33 is at a positive level, then node 35 ramps negatively. The voltage at the non-inverting input of op amp 61 is between the voltages presented on nodes 33 and 35 because of the voltage division through resistors 62 and 60. When the voltage on the noninverting input to op amp 61 crosses zero volts, op amp 61 switches causing node 33 to go to a negative level. At the instant of switching, the non-inverting input to op amp 61 jumps to a negative level due to the positive feedback through resistor 62. Node 35 then tends to sweep in an increasing direction until the non-inverting input to op amp 61 again crosses the zero volt level.

Reversing the polarity of the step signal presented at node 33 is accomplished through the polarity control input coupled to node 31. When the multirate ramp generator is sweeping at the faster sweep rate, node 31 is at a low level. Thus, switch 66 is open and switch 68 is closed. Resistor 67 exhibits a relatively small resistance so that the voltage across capacitor 70 closely follows the step signal on node 33. As node 31 switches to the high level signaling the ramp generator to ramp at the slower sweep rate, switch 68 opens and decouples capacitor 70 from node 33. Simultaneously, switch 66 closes coupling capacitor 70 through resistor 65 to the inverting input of op amp 61. This changes the reference voltage at the inverting input of op amp 61 from a ground level to the voltage which appears across capacitor 70 times the voltage division accomplished through resistors 65 and 63. This change in reference voltage causes op amp 61 to switch, thereby reversing the polarity of the step signal presented at node 33.

As shown in FIGS. 3 and 5, node 31 is coupled to the output of one-shot 57 which generates the signal shown in trace 57′. The duration of the one-shot 57 pulse is relatively short. Therefore, node 31 is restored to a low level, and the reference voltage at the inverting input of op amp 61 is restored to a ground level after a short period of time.

The foregoing description has focused on particular embodiments of the present invention. However, those skilled in the art will recognize that many modifications to the described embodiments will not depart from the scope of the present invention. For example, digital techniques may be used to implement the multirate ramp generator and comparator circuit 25, such as circuits which employ counters and digital comparators, respectively. In this situation, a numerically controlled oscillator may advantageously serve as variable frequency oscillator 22.

The ramp generator portion of the present invention may produce a signal that does not exhibit a constant rate of change. However, the optimum signal exhibits a constant rate of change to minimize acquisition time. Such a ramp generator may be simply accommodated by implementing a design which considers the worst case rates of change.

Furthermore, those skilled in the art could devise many different circuits each of which could accomplish the functions performed by sweep control circuit 30 or comparator circuit 25. One-shots could be replaced with counters, and various memory elements and gates could be used to replace the flip-flops and gates described herein. These changes and modifications are intended to be included within the scope of the present invention.

We claim:

1. A tracking phase locked loop circuit for locking to an incoming signal exhibiting an incoming frequency, said circuit comprising:
   a mixer having first and second inputs and a mixer output, said mixer first input being responsive to the incoming signal;
   a variable frequency oscillator having a control input and an oscillator output, the oscillator output being coupled to the second input of said mixer and providing a variable frequency signal;
   a multirate ramp generator having an output coupled to the control input of said oscillator, said ramp generator for generating a ramp signal having faster and slower sweep rates independently controlled relative to increasing and decreasing sweep directions;
   a filter having an input coupled to the output of said mixer and having a filter output, said filter exhibiting a cutoff frequency; and
   a sweep control circuit having an input coupled to the filter output and being coupled to said ramp generator, said sweep control circuit being configured to select the faster sweep rate of said ramp generator when the variable frequency of said variable frequency oscillator is less than the incoming frequency minus the cutoff frequency of said filter.

2. A phase locked loop circuit as claimed in claim 1 wherein said sweep control circuit additionally comprises an output for controlling the sweep direction of said ramp generator.

3. A phase locked loop circuit as claimed in claim 1 wherein said filter is a bandpass filter and the filter output produces a bandpass signal having signal peaks.

4. A phase locked loop circuit as claimed in claim 3 wherein said sweep control circuit additionally comprises:

an amplitude detector coupled to the output of said filter for converting the bandpass signal into pulses corresponding in time to peaks of the bandpass signal; and a first timer configured so that the slower sweep rate is selected if two of the pulses occur within a first predetermined period of time.

5. A phase locked loop circuit as claimed in claim 4 wherein said sweep control circuit additionally comprises a second timer configured so that the faster sweep rate is selected if two of the pulses do not occur within a second period of time.

6. A phase locked loop circuit as claimed in claim 1 wherein said ramp generator comprises:

an operational amplifier having a signal input and an output;

a capacitor coupled between the input of said operational amplifier and the output of said operational amplifier;

a first resistor coupled to the signal input of said operational amplifier; and a second resistor coupled to said first resistor.

7. A phase locked loop circuit as claimed in claim 6 additionally comprising a third resistor coupled between the output of said mixer and the signal input of said operational amplifier.

8. A phase locked loop circuit as claimed in claim 6 wherein said sweep control circuit comprises a switch coupled to one of said first and second resistors, said switch being for changing the sweep rate of said ramp generator between the slower and faster sweep rates.

9. A phase locked loop circuit as claimed in claim 1 additionally comprising a comparator circuit coupled to the output of said ramp generator, said comparator circuit for detecting when the ramp signal is greater than a first predetermined level and when the ramp signal is less than a second predetermined level.

10. A phase locked loop circuit as claimed in claim 9 wherein:

said comparator circuit applies a step signal having a polarity of said ramp generator; and said comparator circuit additionally comprises a polarity control input coupled to said sweep control circuit for reversing the polarity of the step signal in response to a signal presented at the polarity control input.

11. A phase locked loop circuit as claimed in claim 10 additionally comprising:

means for signaling that the phase locked loop circuit is in an inlock state; and a switch having a first contact coupled to said comparator circuit, a second contact coupled to said ramp generator, and a control input coupled to said signaling means.

12. A method of acquiring a carrier using a tracking phase locked loop having a variable frequency oscillator and having a mixer which produces a beat signal, said method comprising the steps of:

varying the frequency of the oscillator over a predetermined range;

initially selecting a sweep direction and a relatively faster sweep rate in said varying step;

filtering the beat signal to produce a filter signal having signal peaks;

detecting said signal peaks from the filter signal of said filtering step; and operatively selecting a relatively slower sweep rate when one of said signal peaks is detected in said detecting step.

13. A method as claimed in claim 12 wherein said filtering attenuates beat signal frequencies which are above and below a predetermined frequency range.

14. A method as claimed in claim 13 additionally comprising the steps of:

starting a first timer when said detecting step indicates the occurrence of a first one of said signal peaks after said initially selecting step;

preventing said operatively selecting step from selecting the relatively slower sweep rate upon the occurrence of of only said first one of said signal peaks;

indicating if the timer started in said starting step shows the passage of less than a first predetermined amount of time when said detecting step indicates the occurrence of a second one of said signal peaks;

permitting said operatively selecting step to select the relatively slower sweep rate if an indication is given by said indicating step; and reversing the sweep direction if an indication is given by said indicating step.

15. A method as claimed in claim 14 additionally comprising the steps of:

starting a second timer upon the detection of said second one of said signal peaks from the filter signal of said filtering step;

selecting the relatively faster sweep rate if the second timer indicates the passage of a second predetermined amount of time before said detecting step indicates the occurrence of a third one of said signal peaks.

16. A tracking phase locked loop circuit for locking to a carrier having an uncertain frequency, said circuit comprising:

a mixer having first and second inputs and an output, said mixer first input being responsive to the carrier;

a voltage controlled oscillator having a control input and an oscillator output, the oscillator output being coupled to the second input of said mixer;

an operational amplifier having a signal input and an output, said operational amplifier output being coupled to the control input of said voltage controlled oscillator;

a capacitor coupled between said operational amplifier input and output;

a first resistor having first and second nodes, said first resistor first node being coupled to said operational amplifier input;

a second resistor being coupled to said first resistor;

a third resistor coupled between the output of said mixer and the signal input of said operational amplifier;

a comparator circuit coupled to the output of said operational amplifier, said comparator circuit for detecting when a signal generated by said operational amplifier is greater than a first predetermined level and when the signal generated by said operational amplifier is less than a second predetermined level;

a bandpass filter having an input coupled to the mixer output and having an output for producing a bandpass signal having signal peaks; and a sweep control circuit having:

an amplitude detector coupled to the output of said bandpass filter for converting the bandpass signal into pulses corresponding in time to peaks of the bandpass signal, a first timer configured to detect if two of the pulses occur within a first predetermined period of time, a first switch coupled to one of said first and second resistors, and an out-put coupled to said comparator circuit.

* * * * *